(12) United States Patent
Kim et al.

(10) Patent No.: US 9,618,809 B2
(45) Date of Patent: Apr. 11, 2017

(54) LIQUID CRYSTAL DISPLAY AND METHOD FOR MANUFACTURING SAME

(71) Applicant: Samsung Display Co., Ltd, Yongin-si, Gyeonggi-do (KR)

(72) Inventors: Seul Ki Kim, Incheon (KR); Seung Jin Kim, Asan-si (KR); Yun Seok Han, Cheonan-si (KR); Dong Ju Yang, Seoul (KR); Jeong Uk Heo, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/980,755

(22) Filed: Dec. 28, 2015

(65) Prior Publication Data

US 2017/0010497 A1    Jan. 12, 2017

(30) Foreign Application Priority Data

Jul. 6, 2015 (KR) ........................ 10-2015-0096088

(51) Int. Cl.
| | |
|---|---|
| *H01L 27/12* | (2006.01) |
| *G02F 1/1343* | (2006.01) |
| *G02F 1/1333* | (2006.01) |
| *G02F 1/1368* | (2006.01) |
| *G02F 1/1362* | (2006.01) |

(52) U.S. Cl.
CPC ........ *G02F 1/13439* (2013.01); *G02F 1/1368* (2013.01); *G02F 1/133345* (2013.01); *G02F 1/134309* (2013.01); *G02F 1/136286* (2013.01); *H01L 27/124* (2013.01); *H01L 27/1248* (2013.01); *H01L 27/1262* (2013.01); *G02F 2001/136295* (2013.01)

(58) Field of Classification Search
CPC .......................... H01L 27/124; H01L 27/1251
See application file for complete search history.

(56) References Cited

FOREIGN PATENT DOCUMENTS

| JP | 2009-271105 | 11/2009 |
|---|---|---|
| KR | 10-2009-0076812 A | 7/2009 |
| KR | 10-2012-0080885 A | 7/2012 |
| KR | 10-2015-0002280 A | 1/2015 |

*Primary Examiner* — Thanh V Pham
(74) *Attorney, Agent, or Firm* — Innovation Counsel LLP

(57) ABSTRACT

A method for manufacturing a liquid crystal display, including: preparing a substrate on which a switching element, laminating a conductive material layer and a conductive metal layer, forming a first photosensitive film pattern on the conductive metal layer, the first photosensitive film pattern comprising a first region having a first thickness and a second region having a second thickness greater than the first thickness, forming a conductive metal pattern by etching the conductive metal layer using the first photosensitive film pattern as a mask, forming a second photosensitive film pattern that exposes a part of the conductive metal pattern by removing the first region of the first photosensitive film pattern, forming a common electrode by etching the conductive material layer by using the conductive metal pattern as a mask and forming an auxiliary electrode by etching the exposed conductive metal pattern using the second photosensitive film pattern as a mask.

11 Claims, 16 Drawing Sheets

(a)

(b)

LIQUID CRYSTAL DISPLAY AND METHOD FOR MANUFACTURING SAME

This application claims priority from Korean Patent Application No. 10-2015-0096088 filed on Jul. 6, 2015 in the Korean Intellectual Property Office, the disclosure of which is hereby incorporated by reference for all purposes as if fully set forth herein.

BACKGROUND

1. Field

The present disclosure relates to a liquid crystal display and a method for manufacturing the same.

2. Discussion

The importance of a display has increased with the development of multimedia. In response to this, various kinds of displays, such as a liquid crystal display (LCD) and an organic light emitting display (OLED), are being used.

The liquid crystal display is a widely used type of flat panel displays at present, and includes two substrates in which field generating electrodes, such as a pixel electrode and a common electrode, are formed, and a liquid crystal layer contained between the substrates. The liquid crystal display generates an electric field in the liquid crystal layer by applying a voltage to the field generating electrode. By controlling the strength of the electric field, the liquid crystal display determines the direction of the liquid crystal molecules in the liquid crystal layer, and displays an image by controlling the polarization of the incident light.

As the resolution of the liquid crystal display increases, an increase in the size of the substrate, which may be made of glass, and a thin film transistor (TFT) having excellent performance are required.

SUMMARY

Aspects of the present disclosure provide a liquid crystal display capable of preventing an undercut that may be generated below the common electrode when each of a common electrode and an auxiliary electrode is independently etched, and a method for manufacturing the same.

According to an exemplary embodiment, a method for manufacturing a liquid crystal display includes: preparing a substrate on which a switching element covered with a first insulating film is formed, laminating a conductive material layer and a conductive metal layer on the first insulating film; forming a first photosensitive film pattern on the conductive metal layer, the first photosensitive film pattern comprising a first region having a first thickness and a second region having a second thickness greater than the first thickness; forming a conductive metal pattern by etching the conductive metal layer by using the first photosensitive film pattern as a mask; forming a second photosensitive film pattern that exposes a part of the conductive metal pattern by removing the first region of the first photosensitive film pattern; after forming the second photosensitive film pattern, forming a common electrode by etching the conductive material layer by using the conductive metal pattern as a mask; and forming an auxiliary electrode by etching the exposed conductive metal pattern by using the second photosensitive film pattern as a mask.

The method further may include, after forming the auxiliary electrode, forming a second insulating film on the auxiliary electrode and the common electrode; and forming a pixel electrode on the second insulating film.

A gate line may be further formed on the substrate, and the gate line may comprise a gate electrode extending in a first direction and connected to the switching element. The auxiliary electrode may be formed to be disposed in the first direction.

The auxiliary electrode may be formed to at least partially overlap the gate line.

Forming the conductive metal pattern may comprise forming the conductive metal pattern through a wet etching by using the first photosensitive film pattern as a mask.

Forming the common electrode may comprise forming the common electrode through a first wet etching by using the conductive metal pattern as a mask. Forming the auxiliary electrode may comprise forming the auxiliary electrode through a second wet etching by using the second photosensitive film pattern as a mask.

Different etchants may be used in the first and second wet etching use.

The auxiliary electrode may be formed from at least one material selected from aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi).

Preparing the substrate may comprise: forming a gate line on the substrate, forming a semiconductor pattern, a source electrode and a drain electrode on the gate line so as to be insulated from the gate line and forming a first insulating film that is disposed on the source electrode and the drain electrode and exposes at least a part of the drain electrode.

Forming the semiconductor pattern, the source electrode and the drain electrode may comprise: sequentially laminating a semiconductor layer and a conductive metal layer on the gate insulating film disposed on the gate line, forming a third photosensitive film pattern on the conductive metal layer, the third photosensitive film pattern comprising a third region having a third thickness and a fourth region having a fourth thickness greater than the third thickness, forming a conductive metal pattern and a semiconductor pattern by etching the conductive metal layer and the semiconductor layer by using the third photosensitive film pattern as a mask, forming a fourth photosensitive film pattern that exposes a part of the electrode pattern by removing the third region of the third photosensitive film pattern and forming the source and drain electrodes by etching the conductive metal pattern by using the fourth photosensitive film pattern as a mask.

One end of the source electrode and one end of the semiconductor pattern may be located on the same plane, and one end of the drain electrode and another end of the semiconductor pattern may be located on the same plane.

According to an exemplary embodiment, a method for manufacturing a liquid crystal display comprises: preparing a substrate on which a switching element covered with a first insulating film is formed; laminating a conductive material layer and a conductive metal layer on the first insulating film; forming a first photosensitive film pattern on the conductive metal layer, the first photosensitive film pattern comprising a first region having a first thickness and a second region having a second thickness greater than the first thickness; forming a conductive metal pattern by etching the conductive metal layer by using the first photosensitive film pattern as a mask; forming a common electrode by etching the conductive material layer by using the conductive metal pattern as a mask; after forming the common electrode, forming a second photosensitive film pattern that exposes a part of the conductive metal pattern by removing the first region of the first photosensitive film pattern; and forming an auxiliary electrode by etching the exposed conductive metal pattern by using the second photosensitive film pattern as a mask.

The method may further include, after forming the auxiliary electrode, forming a second insulating film on the auxiliary electrode and the common electrode and forming a pixel electrode on the second insulating film.

A gate line may be further formed on the substrate, the gate line comprising a gate electrode extending in a first direction and connected to the switching element, and the auxiliary electrode is formed to be disposed in the first direction.

Preparing the substrate may comprise: forming a gate line on the substrate, forming a semiconductor pattern, a source electrode and a drain electrode on the gate line so as to be insulated from the gate line and forming a first insulating film that is disposed on the source electrode and the drain electrode and exposes at least a part of the drain electrode.

Forming the semiconductor pattern, the source electrode and the drain electrode may comprise: sequentially laminating a semiconductor layer and a conductive metal layer on the gate insulating film disposed on the gate line, forming a third photosensitive film pattern on the conductive metal layer, the third photosensitive film pattern comprising a third region having a third thickness and a fourth region having a fourth thickness greater than the third thickness, forming an electrode pattern and the semiconductor pattern by etching the conductive metal layer and the semiconductor layer by using the third photosensitive film pattern as a mask, forming a fourth photosensitive film pattern that exposes a part of the electrode pattern by removing the third region of the third photosensitive film pattern and forming the source and drain electrodes by etching the electrode pattern by using the fourth photosensitive film pattern as a mask.

According to an exemplary embodiment, a liquid crystal display comprises: a gate electrode disposed on a substrate, a semiconductor pattern disposed on the gate electrode so as to be insulated from the gate electrode; a source electrode and a drain electrode disposed on the semiconductor pattern; an organic insulating film disposed on the source and drain electrodes and exposing at least a part of the drain electrode; a common electrode disposed on the organic insulating film; an auxiliary electrode disposed on the common electrode; and a pixel electrode disposed on the auxiliary electrode so as to be insulated from the auxiliary electrode, wherein one end of the source electrode and one end of the semiconductor pattern are located on the same plane, and one end of the drain electrode and another end of the semiconductor pattern are located on the same plane.

The auxiliary electrode may be disposed in the same direction as the gate line.

The auxiliary electrode may be disposed so as to at least partially overlap the gate line.

The liquid crystal display may further include a passivation film disposed on the common electrode and the auxiliary electrode, wherein the pixel electrode is disposed on the passivation film and is electrically connected to the drain electrode through a contact hole.

BRIEF DESCRIPTION OF THE DRAWINGS

The above and other aspects and features of the present disclosure will become more apparent when the exemplary embodiments disclosed herein are considered in conjunction with the attached drawings, in which.

DETAILED DESCRIPTION

The accompanying drawings, which are included to provide a further understanding of the inventive concept, are incorporated in and constitute a part of this specification. The accompanying drawings illustrate exemplary embodiments of the inventive concept, and, together with the description, serve to explain principles of the inventive concept.

Figure 1:
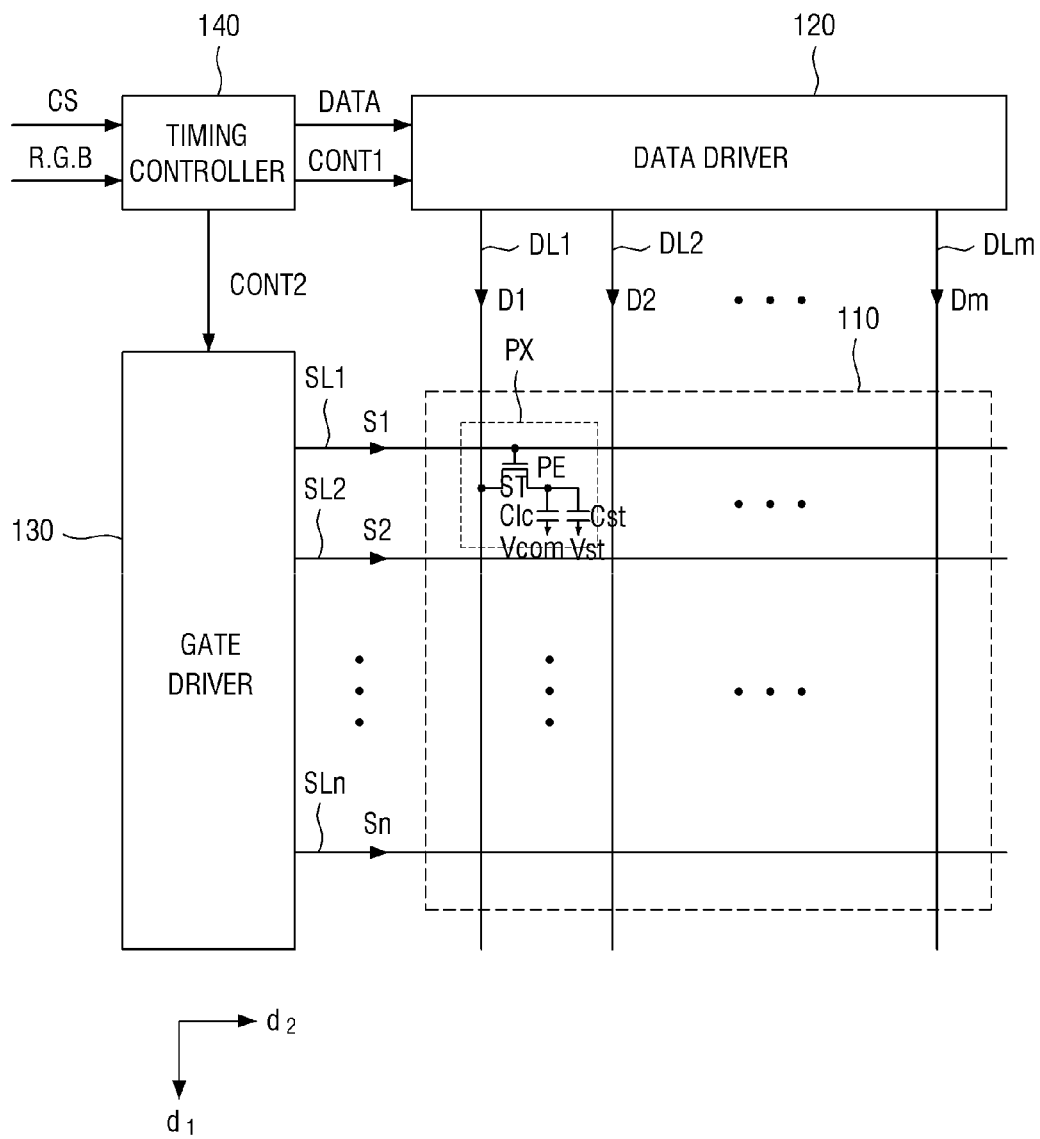
FIG. 1 is a block diagram illustrating a liquid crystal display according to an embodiment of the present disclosure.

FIG. 1 is a block diagram of an organic light emitting display according to one or more exemplary embodiments.

Figure 2:
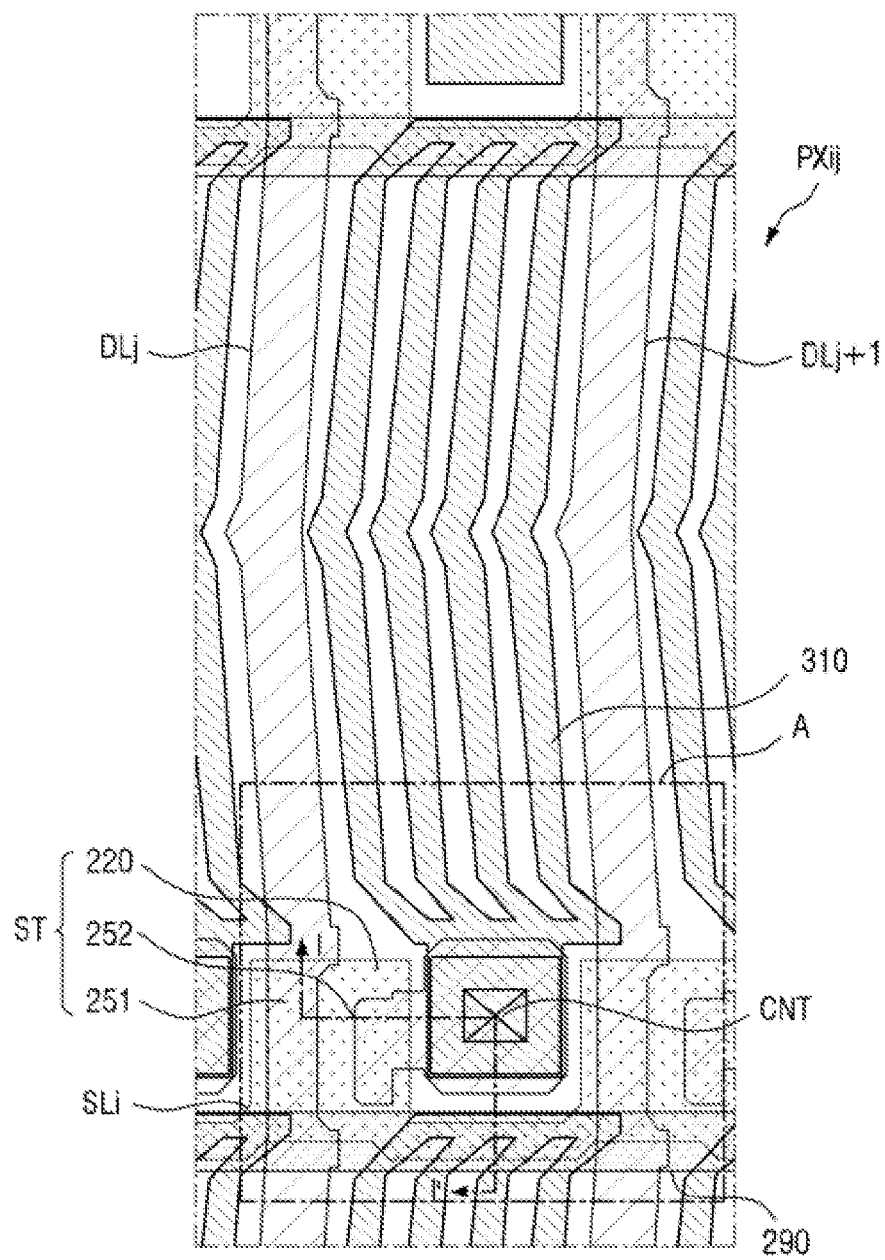
FIG. 2 is a layout diagram illustrating an example of a pixel portion illustrated in FIG. 1.

FIG. 2 is a circuit diagram of an example of a pixel group included in a display panel in the configuration of the organic light emitting display illustrated in FIG. 1.

Figure 3:
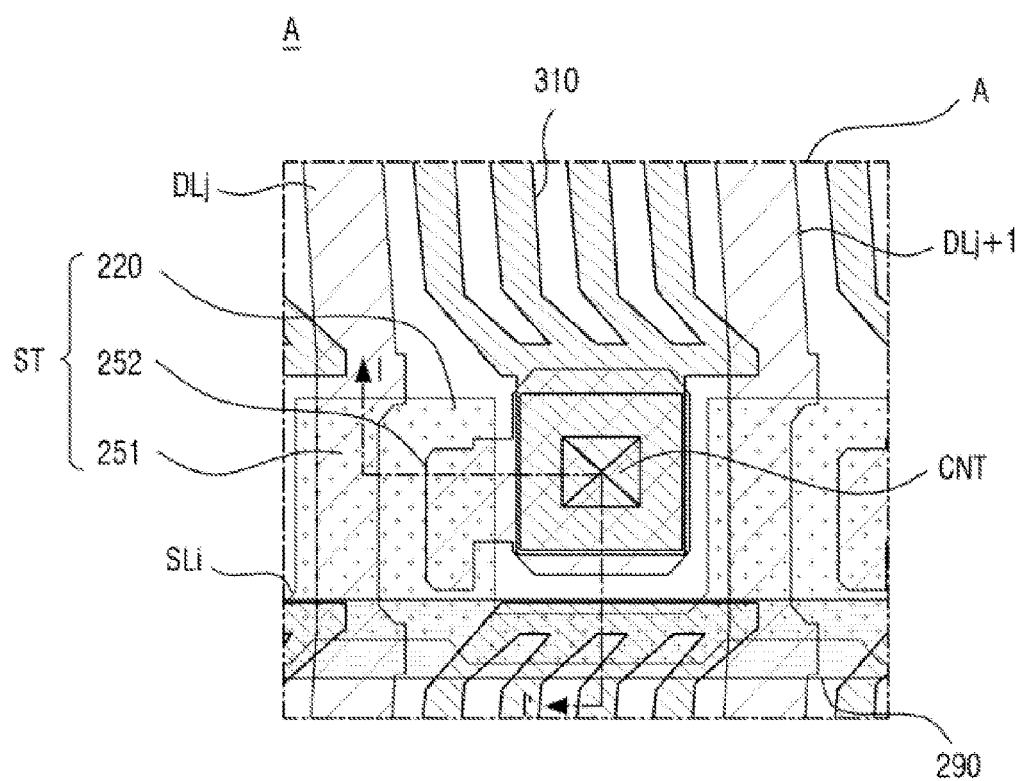
FIG. 3 is an enlarged view of a region A of FIG. 2.

FIG. 3 is a circuit diagram of another example of a pixel group in the configuration of an organic light emitting display according to one or more exemplary embodiments.

Figure 4:
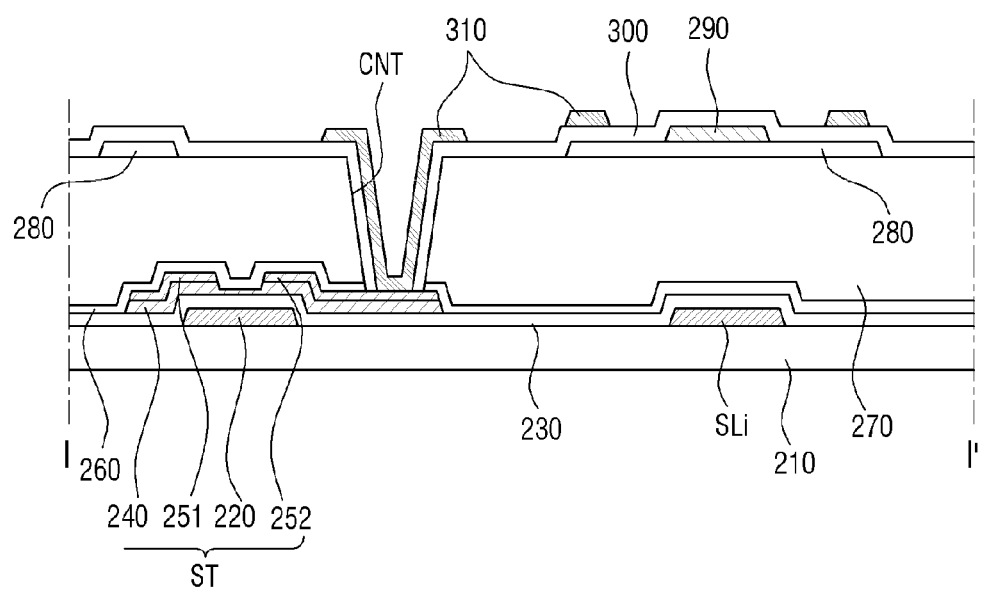
FIG. 4 is a cross-sectional view taken along a I-I' direction of FIG. 2.

FIG. 4 is a timing diagram explaining a method for driving an organic light emitting display according to one or more exemplary embodiments.

DETAILED DESCRIPTION OF THE ILLUSTRATED EMBODIMENTS

In the following description, for the purposes of explanation, numerous specific details are set forth to provide a thorough understanding of various exemplary embodiments. It is apparent, however, that various exemplary embodiments may be practiced without these specific details or with one or more equivalent arrangements. In other instances, well-known structures and devices are shown in block diagram form to avoid unnecessarily obscuring various exemplary embodiments.

In the accompanying figures, the absolute and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer, or intervening elements or layers may be present. When an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections are not limited by these terms. These terms are used to distinguish one element, component, region, layer, and/or section from another element, component, region, layer, and/or section. Thus, a first element, component, region, layer, and/or section discussed below may be referred to as a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein may be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the meaning as commonly understood by one of ordinary skill in the art to which this disclosure pertains. Terms, including those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the present disclosure are described with reference to the attached drawings.

FIG. 1 is a block diagram illustrating a liquid crystal display according to an embodiment of the present disclosure.

Referring to FIG. 1, a liquid crystal display according to an embodiment of the present disclosure may include a display panel 110, a data driver 120, a gate driver 130 and a timing controller 140.

The display panel 110 is a panel that displays an image. The display panel 110 may be a liquid crystal panel that includes a lower display panel, an upper display panel facing the lower display panel, and a liquid crystal layer interposed therebetween. The display panel 110 may include a plurality of gate lines SL1 to SLn and a plurality of data lines DL1 to DLm. The display panel 110 may include a plurality of pixel portions PX that is disposed in a region in which the plurality of gate lines SL1 to SLn intersects with the plurality of data lines DL1 to DLm. The plurality of gate lines SL1 to SLn, the plurality of data lines DL1 to DLm, and the plurality of pixel portions PX may be disposed on the lower display panel of the display panel 110.

The plurality of pixel portions PX may be disposed, for example, in a matrix shape. Further, the plurality of data lines DL1 to DLm may extend on the lower display panel along a first direction d1, and the plurality of gate lines SL1 to SLn may extend along a second direction d2 that intersects with the first direction d1. In FIG. 1, the first direction d1 is a column direction (a vertical direction), and the second direction d2 is a row direction (a horizontal direction). Each of the plurality of pixel portions PX may receive the data signal from the data lines DL1 to DLm in response to the gate signal provided to the gate lines SL1 to SLn adjacent to the pixel portions.

The plurality of pixel portions PX may include a switching element ST, a liquid crystal capacitor Clc and a storage capacitor Cst. Hereinafter, among the plurality of pixel portions PX, a first pixel portion PX connected to each of the first gate line SL1 and the first data line DL1 is described as an example.

The switching element ST may be a three-terminal element, such as a thin film transistor for example. The switching element ST may be configured such that a gate electrode is connected to the first gate line SL1, an input electrode is connected to the first data line DL1, and an output electrode is connected to an electrode of the liquid crystal capacitor Clc, i.e., a pixel electrode PE. For example, the input electrode of the switching element ST may be a source electrode, and the output electrode of the switching element ST may be a drain electrode. The switching element ST may perform the switching operation according to the first gate signal S1 provided from the first gate line SL1, and may provide the first data signal D1 provided from the first data line DL1 to the pixel electrode PE.

The liquid crystal capacitor Clc may be formed between the pixel electrode PE and the common electrode Vcom opposite thereto. The storage capacitor Cst may be formed between the output electrode of the switching element ST and a maintenance line Vcst to which the maintenance voltage is applied.

The liquid crystal display may further include a power source supply unit (not illustrated). The supply source supply unit may supply the operating power of the liquid crystal display, and may provide a common voltage to the display panel 110 through a common line (not illustrated). Also, the plurality of pixel portions PX may be connected to the maintenance line that provides the commonly applied maintenance voltage.

The data driver 120 may include a shift register, a latch, a digital-analog converter DAC or the like. The data driver 120 may receive a first control signal CONT1 and an image data DATA from the timing controller 140. The data driver 120 may select a reference voltage in response to the first control signal CONT1, and may convert the image data DATA of the digital waveform input on the basis of the selected reference voltage into a plurality of data signals D1 to Dm. The data driver 120 may provide the plurality of generated data signals D1 to Dm to the display panel 110.

The gate driver 130 may receive the second control signal CONT2 from the timing controller 140. The gate driver 130 may provide a plurality of gate signals S1 to Sn to the display panel 110 according to the provided second control signal CONT2.

The timing controller 140 may receive the input of the image signals R, G, B and the control signals CS from an external source (not shown). The control signal CS may include a vertical synchronization signal Vsync, a horizontal synchronization signal Hsync, a main clock signal MCLK and a data enable signal DE. After the timing controller 140 processes the signals provided from the external source to match the operating conditions of the display panel 110, the timing controller 140 may generate the image data DATA, the first control signal CONT1 and the second control signal CONT2. The first control signal CONT1 may include a horizontal synchronization start signal STH that instructs the input start of the image data DATA, and a load signal TP that controls the application of the plurality of data signals D1 to Dm to the plurality of data lines DL1 to DLm. The second control signal CONT2 may include a scan start signal STV that instructs the output start of the plurality of gate signal S1 to Sn, and a gate clock signal CPV that controls the output timing of the scan-on-pulse.

FIG. 2 is a layout diagram illustrating an example of a pixel portion illustrated in FIG. 1. FIG. 2 illustrates the pixel portion PXij that is connected to a j-th data line DLj and an i-th gate line SLi of the plurality of pixel portions PX of FIG. 1. FIG. 3 is an enlarged view of a region A of FIG. 2. FIG. 4 is a cross-sectional view taken along the line I-I' shown in FIG. 3.

As illustrated in FIGS. 2 to 4, in the liquid crystal display according to an embodiment of the present disclosure, the i-th gate line SLi including the gate electrode 220 may be disposed on the lower substrate 210.

The lower substrate 210 may be, for example, a transparent glass substrate, a plastic substrate or the like and may be an array substrate on which a plurality of switching elements is disposed.

The i-th gate line SLi may include a gate electrode 220 and a gate pad section (not illustrated) that protrude or expand to overlap with a semiconductor pattern 240. The gate pad section may be connected to another layer or an external driving circuit. The gate pad section may be omitted.

The i-th gate line SLi may be formed of a single film selected from the conductive metals including aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), a double film made up of at least two elements or a triple film made up of three elements.

The gate insulating film 230 may be disposed on the i-th gate line SLi and the gate electrode 220. The gate insulating film 230 may be formed of silicon nitride (SiNx) or silicon oxide (SiOx) in one embodiment. The gate insulating film 230 may also have a multilayer structure that includes at least two insulating layers having different physical properties.

The semiconductor pattern 240 may be disposed on the gate insulating film 230. The semiconductor pattern 240 may be made of amorphous silicon, polycrystalline silicon or the like. In another embodiment, one selected from an oxide semiconductor containing In—Ga-Zinc-Oxide (IGZO), ZnO, ZnO2, CdO, SrO, SrO2, CaO, CaO2, MgO, MgO2, InO, In2O2, GaO, Ga2O, Ga2O3, SnO, SnO2, GeO, GeO2, PbO, Pb2O3, Pb3O4, TiO, TiO2, Ti2O3 and Ti3O5 may be used as the semiconductor pattern 240. The semiconductor pattern 240 is disposed to at least partially overlap the gate electrode 220. Further, the semiconductor pattern 240 may be disposed to overlap the data wire, such as the data lines, and source and drain electrodes 251, 252. For example, when forming the data wire and the semiconductor pattern 240 using a single mask process, the semiconductor pattern 240 may be disposed below all the data wires. Therefore, the semiconductor pattern 240 may have generally the same pattern as the data lines. However, the form may be different in the channel section. That is, the source and the drain electrodes 251, 252 are patterned to be spaced apart from each other in the channel section, but the semiconductor pattern 240 may have a shape connected to cover the spaced area in this section. According to an exemplary embodiment, a patterning process using a halftone mask or a slit mask may be used as the method for patterning the different shapes of the data wire and the semiconductor pattern 240 in some regions.

Although it is not illustrated in the drawings, a resistive contact layer (not illustrated) may be disposed on the semiconductor pattern 240. The resistive contact layer may be made of a material, such as n+hydrogenated amorphous silicon, in which n-type impurities, such as phosphorus, are doped at a high concentration, or may be made of silicide. The resistive contact layer may have exactly the same pattern as the data wire.

The j-th data line DLj and the source and drain electrodes 251, 252 may be disposed on the gate insulating film 230, the semiconductor pattern 240 and the resistive contact layer. The source electrode 251 may be connected to the j-th data line DLj. The drain electrode 252 may be disposed on the same layer as but apart from the source electrode 251 at a predetermined distance. The j-th data line DLj and the source and drain electrodes 251, 252 may be formed of a single film selected from conductive metals including aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), a double film made up of at least two elements or a triple film made up of three elements. However, the j-th data line DLj and the source and drain electrodes 251, 252 are not limited thereto and may be formed of other various types of metals or conductors.

The gate electrode 220, the semiconductor pattern 240 disposed on the gate electrode 220, and the source and drain electrodes 251, 252 disposed on the semiconductor pattern 240 spaced apart from each other may form a switching element ST. A channel of the switching element ST may be formed in a portion of the semiconductor pattern 240 between the source electrode 251 and the drain electrode 252. The switching element ST may provide the j-th data signal DLj received from the j-th data line DLj through the source electrode 251 to a pixel electrode 310 that is electrically connected to the drain electrode 252 through a contact hole CNT.

The source electrode 251 may include a first side surface that is located relatively farther from the drain electrode 252 and a second side surface that is located relatively closer to the drain electrode 252. The drain electrode 252 may include a first side surface disposed to face the second side surface of the source electrode 251, and a second side surface that is disposed opposite to its first side surface. As described above, since the pattern shapes of the data wire and the semiconductor pattern 240 are the same with the exception of the channel region, a first side surface of the semiconductor pattern 240 may substantially overlap the first side surface of the source electrode 251, and a second side surface of the semiconductor pattern 240 may substantially overlap the second side surface of the drain electrode 252.

A first passivation film 260 may be disposed on the front of the lower substrate 210 including the source and drain electrodes 251, 252. The first passivation film 260 may be formed of an inorganic insulating material such as silicon nitride and silicon oxide.

An organic insulating film 270 that exposes at least a part of the drain electrode 252 may be disposed on the first passivation film 260. The organic insulating film 270 may contain a photosensitive material. When the organic insulating film 270 contains the photosensitive material, the process efficiency may be improved since there is no need to use a separate photoresist when patterning the organic insulating film 270, for example, to form the contact hole CNT.

A common electrode 280 may be disposed on the organic insulating film 270. By generating an electric field between the pixel electrode 310 and the common electrode 280, the alignment direction of liquid crystal molecules interposed between the lower display panel and the upper display panel may be adjusted. The common electrode 280 may be made of a transparent conductive material such as indium tin oxide (ITO) or indium zinc oxide (IZO). The common electrode 280 may be disposed on the entire surface of the lower substrate 210, but the common electrode 280 may include an opening that overlaps the contact hole CNT and is greater than the pixel electrode 310 to avoid short-circuiting with the pixel electrode 310 disposed in the interior of the contact hole CNT. In addition to the opening, the common electrode 280 may further include a slit that serves to form a domain in the portion corresponding to the pixel electrode 310.

An auxiliary electrode 290 may be disposed on the common electrode 280. The auxiliary electrode 290 may serve to enhance the conductivity of the common electrode 280. The auxiliary electrode 290 may be made of a material with resistivity lower than the common electrode 280. Unlike the common electrode 280, the auxiliary electrode 290 may be made of an opaque material. For example, the auxiliary electrode 290 may be formed of a single film selected from conductive metals including aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), a double film made up of at least two elements or a triple film made up of three elements.

The auxiliary electrode 290 may be disposed on some regions of the common electrode 280. For example, the auxiliary electrode 290 may be disposed to at least partially overlap the i-th gate line SLi. That is, the auxiliary electrode 290 may be disposed in a second direction d2 in which the i-th gate line SLi is disposed.

Although it is not illustrated in the drawings, an auxiliary electrode connection section may be formed on a gate pad connection section that is connected to the gate pad. Thus, the auxiliary electrode 290 may be electrically connected to the gate pad through the auxiliary electrode connection section and the gate pad connection section. Further, the auxiliary electrode 290 may be disposed on the common electrode 280 so as to be in contact with the common electrode 280. That is, the auxiliary electrode 290 may be disposed directly on the common electrode 280. Accordingly, the auxiliary electrode 290 may be electrically connected to the common electrode 280. The auxiliary electrode connection section may be formed together in the mask process for forming the common electrode 280 and the auxiliary electrode 290.

A second passivation film 300 may be disposed on the common electrode 280 and the auxiliary electrode 290. The second passivation film 300 may be formed of an inorganic insulating material such as silicon nitride and silicon oxide.

A pixel electrode 310 electrically connected to the drain electrode 252 of the switching element ST through the contact hole CNT may be disposed on the second passivation film 300. The pixel electrode 310 may be disposed on the common electrode 280 to overlap the common electrode 280. The pixel electrode 310 and the common electrode 280 may be electrically insulated from each other by the second passivation film 300.

The pixel electrode 310 may include a slit. The slit generates a fringe field between the pixel electrode 310 and the common electrode 280 to help the liquid crystal to be rotatable in a particular direction. FIG. 2 illustrates a case in which the slit is disposed inside the pixel electrode 310. In FIG. 2, the slit extends in the substantially same direction as the extending direction the j-th data line DLj and is bent at an obtuse angle in a central portion. The upper side of the slit may extend in a right upward direction from the central portion, and the lower side of the slit may extend in the right downward direction. The top and bottom of the pixel electrode 310 may be divided into different domains around the bent portion of the slit. The slit shape and the domains of the pixel electrode 310 described above may be variously changed, and since they are widely known to those skilled in the art, the detailed description thereof is omitted.

The pixel electrode 310 may be made of a transparent conductive material, such as indium tin oxide (ITO) and indium zinc oxide (IZO).

Although it is not illustrated in the drawings, a liquid crystal display according to an embodiment of the disclosure may further include an upper substrate (not illustrated) facing the lower substrate 210, and a liquid crystal layer (not illustrated) interposed between the lower substrate 210 and the upper substrate. A color filter CF and a black matrix (BM) that prevents the light from being transmitted to a region other than the pixel region may be disposed on the upper substrate. In some embodiments, at least one of the black matrix and the color filter may be disposed on the lower substrate 210 instead.

Figure 5:
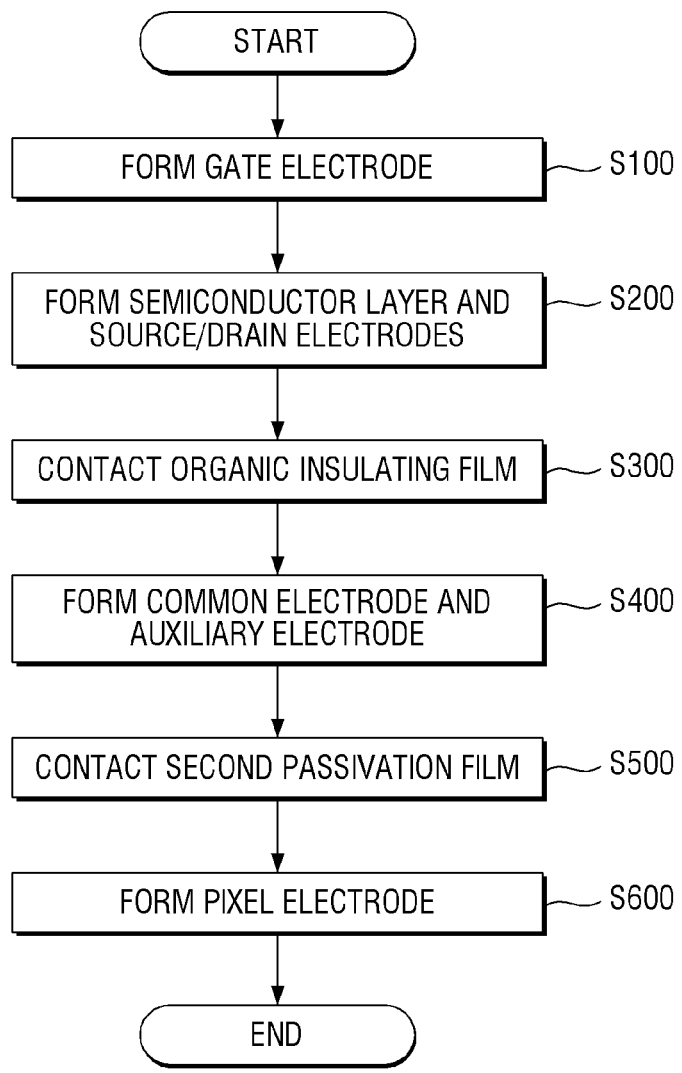
FIG. 5 is a flowchart for explaining a method for manufacturing a liquid crystal display according to an embodiment of the present disclosure.
Figure 6:
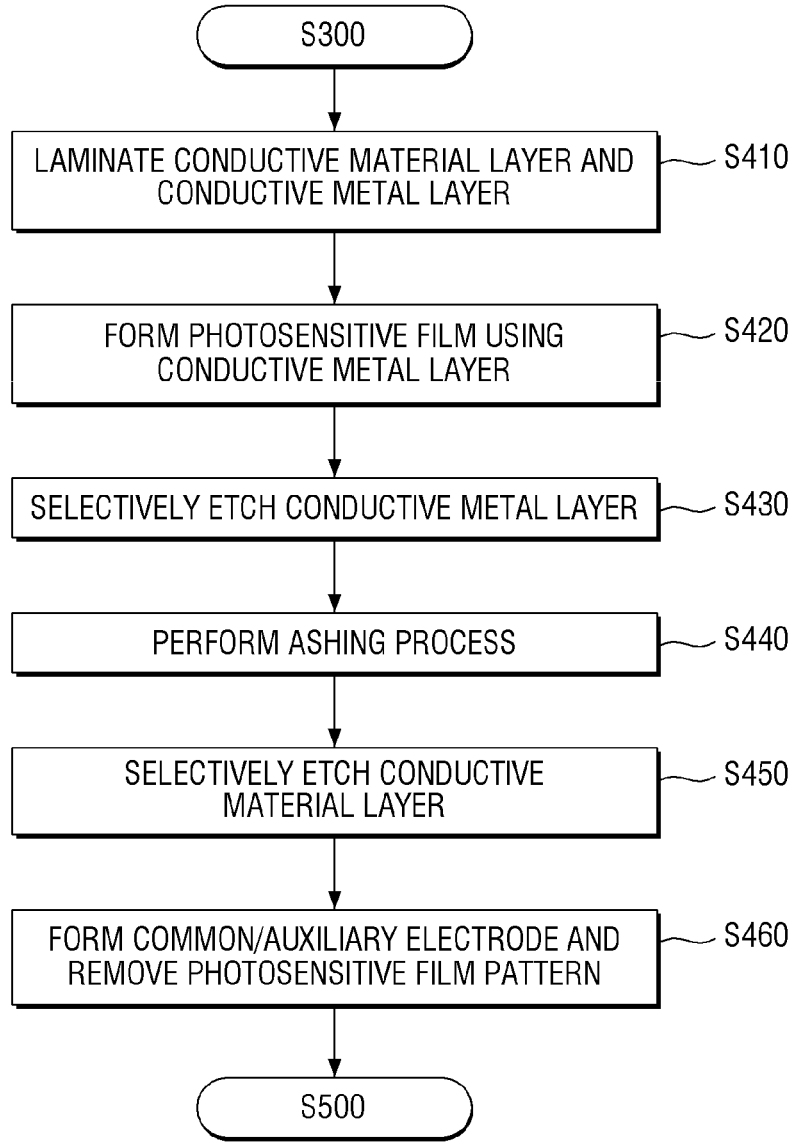
FIG. 6 is a flowchart illustrating a method for forming a common electrode and an auxiliary electrode of the flowchart illustrated in FIG. 5 in more detail.

FIG. 5 is a flowchart for explaining a method for manufacturing the liquid crystal display according to an embodiment of the present disclosure. FIG. 6 is a flowchart that illustrates the method of forming the common electrode 280 and the auxiliary electrode 290 of the flowchart illustrated in FIG. 5 in more detail.

Referring to FIGS. 4 to 6, the method for manufacturing the liquid crystal display according to an embodiment of the present disclosure may include a first mask process (S100) that forms the i-th gate line SLi including the gate electrode 220 on the substrate 210; a second mask process (S200) that forms the semiconductor pattern 240 and the source/drain electrodes 251, 252; a third mask process (S300) that forms an organic insulating film 270 for exposing at least a part of the drain electrode 251; a fourth mask process (S400) that forms the common electrode 280 and the auxiliary electrode 290 on the organic insulating film 270; a fifth mask process (S500) that forms a second passivation film 300 on the common electrode 280 and the auxiliary electrode 290; and a sixth mask process (S600) that forms the pixel electrode 310 on the second passivation film 300.

Figure 7:
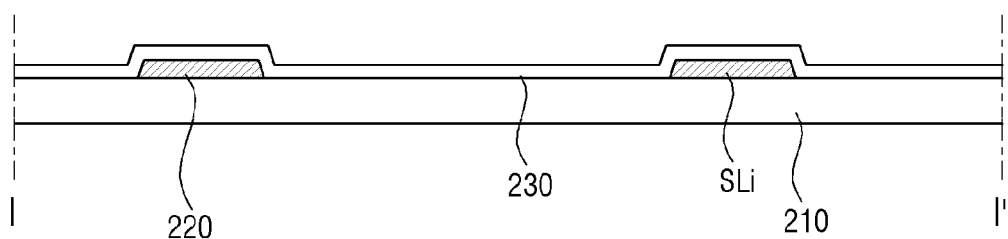
FIG. 7 is a diagram for explaining a first mask process of the method for manufacturing the liquid crystal display according to an embodiment of the present disclosure.

FIG. 7 is a diagram for explaining the first mask process (S100) of the method for manufacturing the liquid crystal display according to an embodiment of the present disclosure. The first mask process (S100) is described first with reference to FIGS. 4, 5 and 7.

First, the i-th gate line SLi is formed on the lower substrate 210. The i-th gate line SLi may include the gate electrode 220 and the gate pad section (not illustrated). More specifically, by forming the gate conductive layer on the lower substrate 210, and by etching the gate conductive layer using a photosensitive film pattern (not illustrated), it is possible to form the i-th gate line SLi having the gate electrode 220 and a gate pad section (not illustrated). The gate conductive layer may be formed of a single film selected from conductive metals including aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), a double film made up of at least two elements or a triple film made up of three elements. However, the present disclosure is not limited thereto, and the gate conductive layer may be formed of several various types of metals or conductors.

Next, the photosensitive film pattern (not illustrated) is removed, and the gate insulating film 230 having the gate electrode 220 is formed on the i-th gate line SLi. The gate insulating film 230 may be formed by a chemical vapor deposition. The gate insulating film 230 is formed on the entire surface of the lower substrate 210 on which the i-th gate line SLi is formed.

FIGS. 8 to 11 are diagrams for explaining the second mask process (S200) of the method for manufacturing the liquid crystal display according to an embodiment of the present disclosure. The second mask process (S200) is described with reference to FIGS. 4, 5 and 8 to 11.

Figure 8:
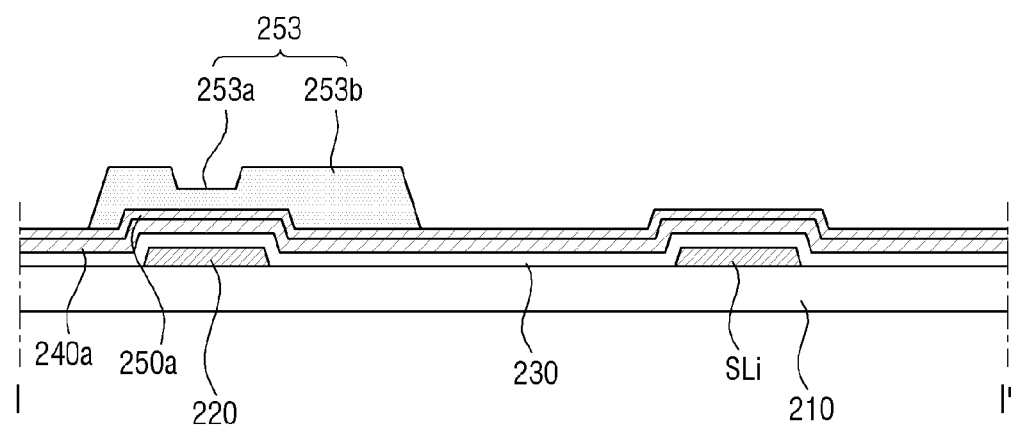
FIGS. 8, 9, 10 and 11 are diagrams for explaining a second mask process of the method for manufacturing the liquid crystal display according to an embodiment of the present disclosure.

Referring to FIG. 8, the semiconductor layer 240a and the conductive material layer 250a are sequentially laminated on the gate insulating film 230. The semiconductor layer 240a may be laminated, for example, by depositing amorphous silicon, polycrystalline silicon or the like using the chemical vapor deposition method. As another example, the semiconductor layer 240a may be formed using an oxide semiconductor, as described above.

The conductive material layer 250a may be formed of a single film selected from conductive metals including aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), a double film made up of at least two elements or a triple film made up of three elements.

Next, by applying a photosensitive film to the top of the conductive material layer 250a, and by exposing and developing the photosensitive film using a halftone mask (not illustrated) and a slit mask, the first photosensitive film pattern 253 is formed. The first photosensitive film pattern 253 includes a first region 253a having a first thickness, and a second region 253b having a second thickness greater than the first thickness. The first region 253a is located in a portion corresponding to a channel region of the switching element, and the second region 253b is located in a portion in which the data wire remains.

Figure 9:
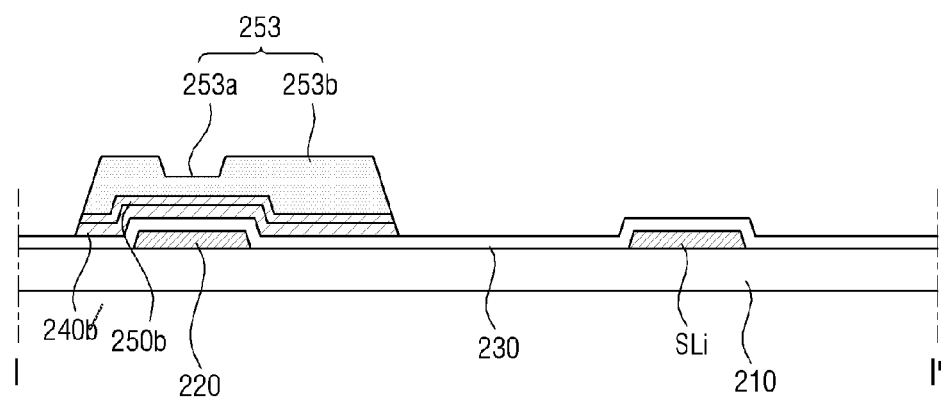

Next, referring to FIG. 9, by etching the exposed conductive material layer 250a by using the first photosensitive film pattern 253 as a mask, the conductive material pattern 250b is formed. Etching of the conductive material layer 250a, for example, may be performed by wet etching. The pattern of the data line is formed through the etching process.

Subsequently, the semiconductor pattern 240b is formed by etching the semiconductor layer 240a by using the first photosensitive film pattern 253 as a mask. The etching process may be performed, for example, by dry etching.

The gate insulating film 230 is exposed through the two etching processes. After the etching processes, one side surface of the conductive material pattern 250b may substantially overlap one side surface of the semiconductor pattern 240b, and the other side surface of the conductive material pattern 250b may substantially overlap the other side surface of the semiconductor pattern 240b.

Figure 10:
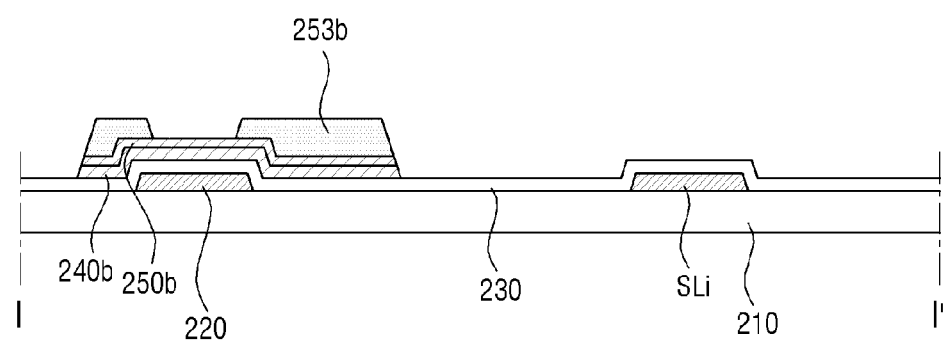

Next, referring to FIG. 10, the thickness of the first photosensitive film pattern 253 is generally reduced to form the second photosensitive film pattern 253b in which the first region 253a is removed. As a result, the conductive material pattern 250b may be exposed in an area corresponding to the channel section. Formation of the second photosensitive film pattern 253b may be performed by an etch-back and an ashing process.

Figure 11:
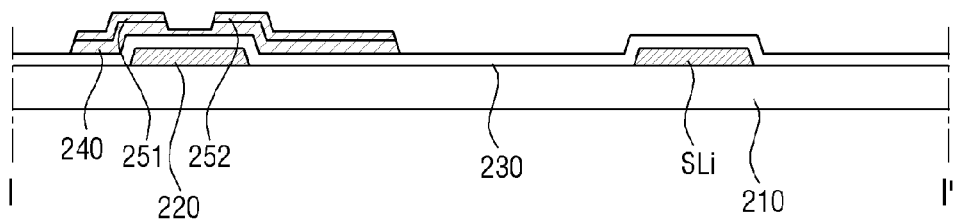

Referring to FIG. 11, the exposed conductive material pattern 250b is etched by using the second photosensitive film pattern 253b as a mask. Thus, the source electrode 251 and the drain electrode 252 disposed spaced apart from each other may be formed. At this time, the semiconductor patterns 240b exposed between the conductive material patterns 250b may be partially etched. As a result, the partially exposed semiconductor pattern 240 is formed. Thereafter, the second photosensitive film pattern 253b is removed.

Figure 12:
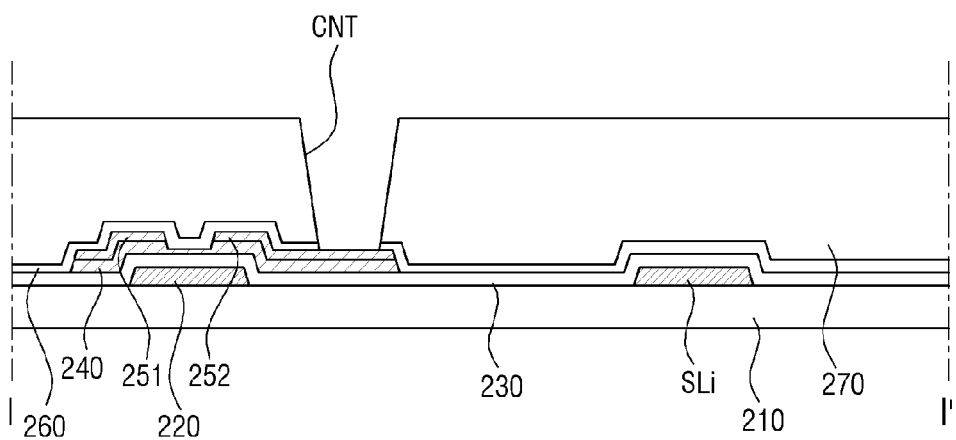
FIG. 12 is a diagram for explaining a third mask process of the method for manufacturing the liquid crystal display according to an embodiment of the present disclosure.

FIG. 12 is a diagram for explaining the third mask process (S300) of the method for manufacturing the liquid crystal display according to an embodiment of the present disclosure. The third mask process (S300) is described with reference to FIGS. 4, 5 and 12.

A first inorganic insulating layer and an organic insulating layer are sequentially formed on the semiconductor pattern 240, the source electrode 251 and the drain electrode 252. The first inorganic insulating layer may be formed of an inorganic insulating material such as silicon nitride and silicon oxide. The organic insulating layer may be formed of an organic material containing a photosensitive material.

When the organic insulating layer contains a photosensitive material, it is possible to form an organic insulating film 270 containing the contact hole CNT as illustrated in FIG. 12 by performing an exposure and development process using a photomask. Next, by etching the first inorganic insulating film exposed on the bottom by using the organic insulating film 270 as an etching mask, it is possible to complete the first passivation film 260 that exposes the drain electrode 252 through the contact hole CNT.

Since the organic insulating layer comprises a photosensitive material in this embodiment, patterning is performed by the direct exposure and development of the organic insulating film without a separate photoresist pattern. In another embodiment, if the separate photoresist pattern is formed on the organic insulating layer, the organic insulating layer and the inorganic insulating layer may be sequentially etched.

FIGS. 13 to 18 are diagrams for explaining the fourth mask process (S400) of the method for manufacturing the liquid crystal display according to an embodiment of the present disclosure. The fourth mask process (S400) is described with reference to FIGS. 4, 6 and 13 to 18.

Figure 13:
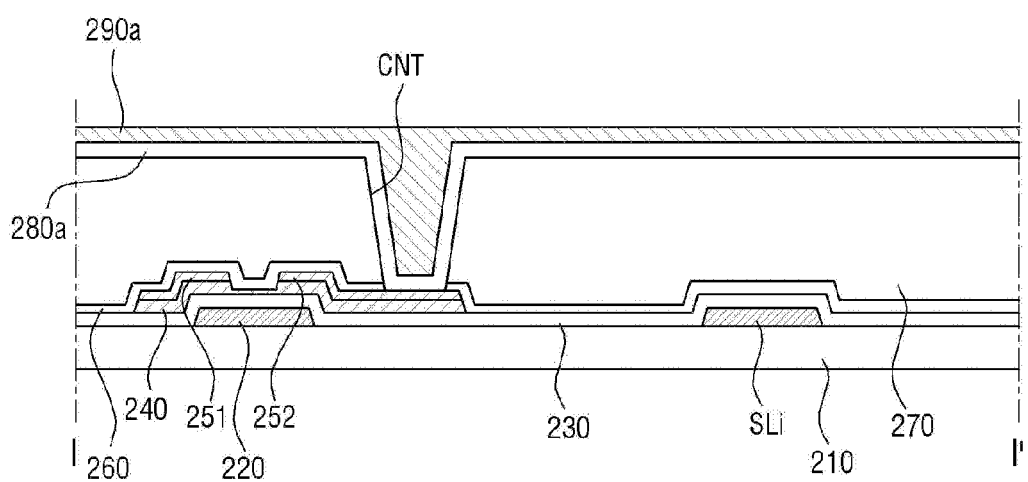
FIGS. 13, 14, 15, 16, 17 and 18 are diagrams for explaining a fourth mask process of the method for manufacturing the liquid crystal display according to an embodiment of the present disclosure.

Referring to FIG. 13, the conductive material layer 280a and the conductive metal layer 290a are sequentially formed on the organic insulating film 270 (S410). The conductive material layer 280a may be formed of a transparent conductive material, such as indium tin oxide (ITO) and indium zinc oxide (IZO). The conductive metal layer 290a may be formed of a single film selected from conductive metals including aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), a double film made up of at least two elements or a triple film made up of three elements.

Figure 14:
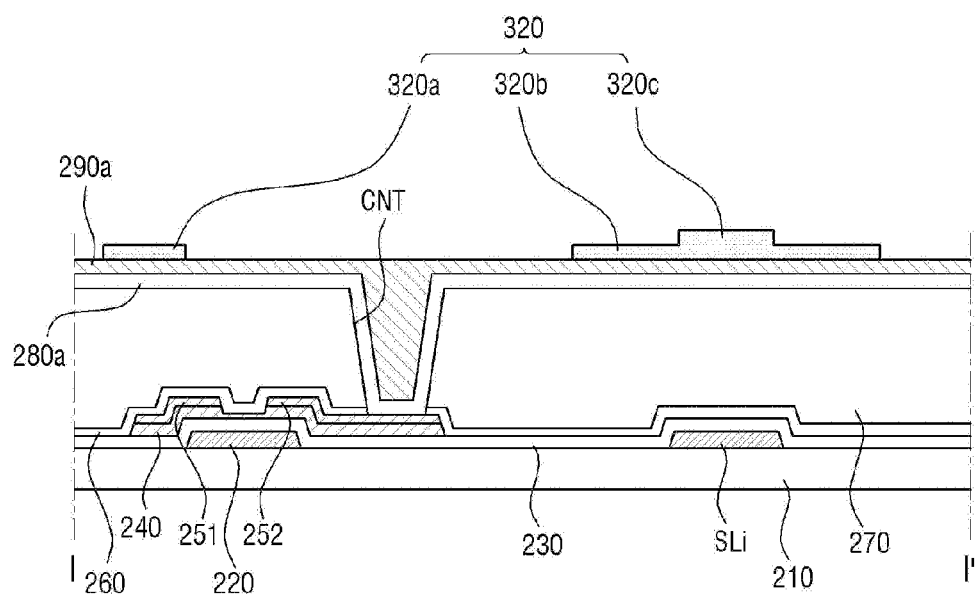

Referring to FIG. 14, by applying a photosensitive film to the top of the conductive metal layer 290a, and by exposing and developing the photosensitive film using a halftone mask (not illustrated) and a slit mask, the third photosensitive film pattern 320 is formed (S420). The third photosensitive film pattern may include first regions 320a, 320b having a third thickness, and a second region 320c having a fourth thickness greater than the third thickness. Here, the third regions 320a, 320b and the fourth region 320c are regions in which the common electrode remains, and the fourth region 320c is a region in which the auxiliary electrode remains. Although the third regions 320a, 320b are illustrated as being spaced from each other in the drawings, the third regions 320a, 320b are regions that surround the opening of the common electrode and may be connected to each other on a plane.

Figure 15:
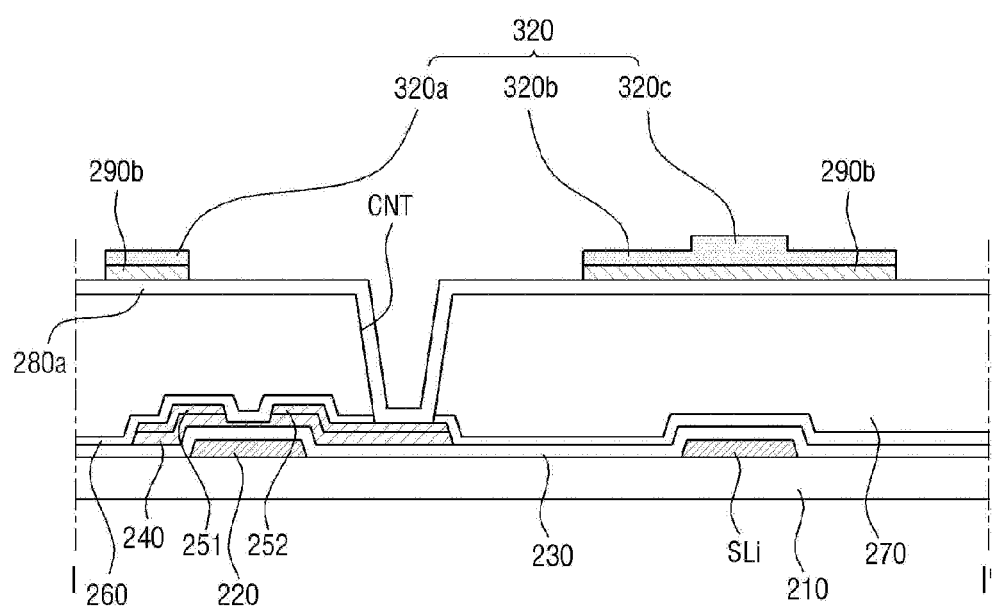

Referring to FIG. 15, by etching the exposed conductive metal layer 290a by using the third photosensitive film pattern 320 as a mask, the conductive metal pattern 290b may be formed (S430). Meanwhile, the process for selectively removing a part of the conductive metal layer 290a may be a first wet process.

Figure 16:
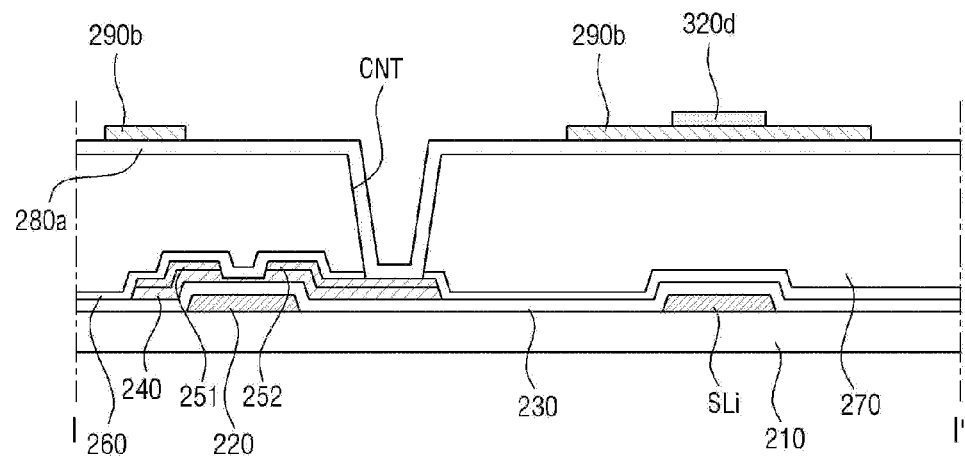

Referring to FIG. 16, the thickness of the third photosensitive film pattern 320 is generally reduced to form the fourth photosensitive film pattern 320d in which the first regions 320a, 320b are removed and only the second region 320c remains. Formation of the fourth photosensitive film pattern 320d may be performed by an etch-back or an ashing process. As a result, a part of the conductive metal pattern 290b may be exposed.

Figure 17:
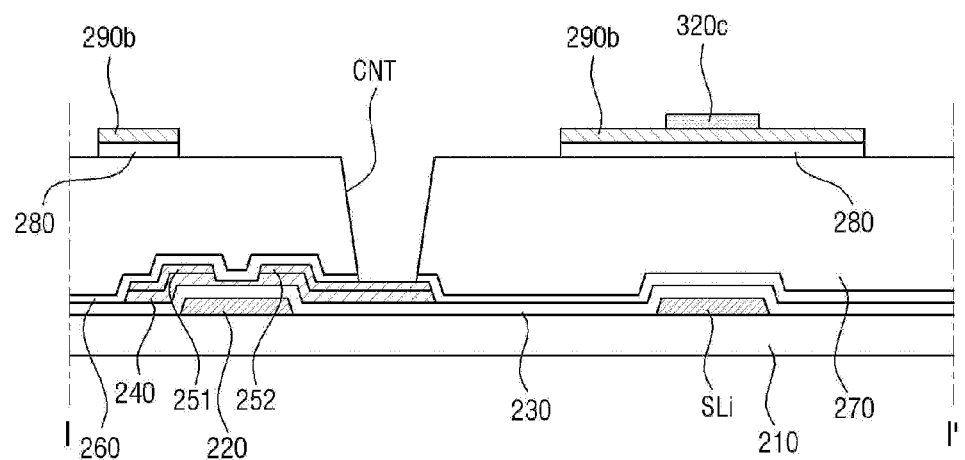

Referring to FIG. 17, the conductive material layer 280a may be etched by using the conductive metal pattern 290b as a mask (S450, S460). As a result, the common electrode 280 may be formed. The process for selectively removing a part of the conductive material layer 280a may be a second wet process. The etchants used in the first and second wet processes may be different from each other. For example, an etchant capable of etching only the conductive metal layer 290a may be used in the first wet process, and an etchant capable of etching only the conductive material layer 280a may be used in the second wet process.

In this specification, although the description has been provided according to the sequence of FIGS. 16 and 17, it is not limited thereto. In a method for manufacturing a liquid crystal display according to another embodiment of the present disclosure, after the formation of the conductive metal pattern 290b, by first etching the conductive material layer 280a, the common electrode 280 may be formed first. Thereafter, the thickness of the third photosensitive film pattern 320 may be generally reduced to form the fourth photosensitive film pattern 320d in which the first regions 320a, 320b are removed and only the second region 320c remains. Formation of the fourth photosensitive film pattern 320d may be performed by an etch-back or an ashing process. As a result, a part of the conductive metal pattern 290b may be exposed.

Figure 18:
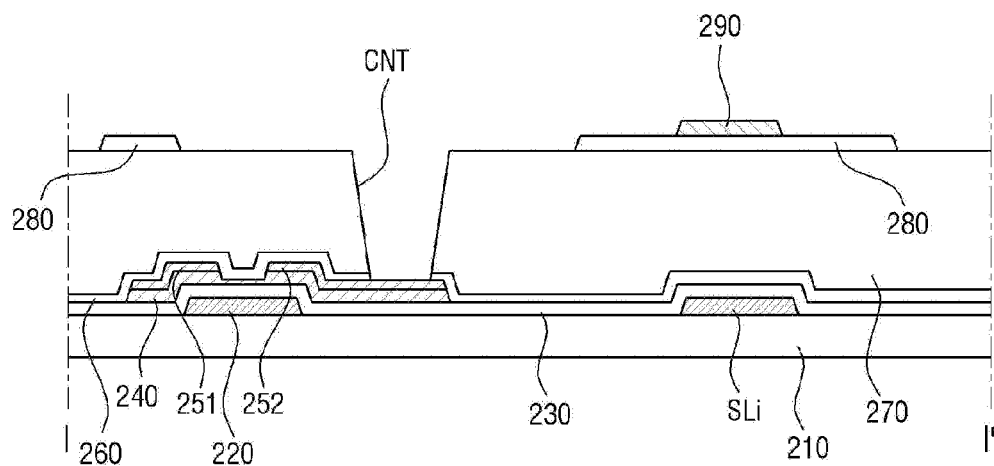

Referring to FIG. 18, the exposed conductive metal pattern 290b may be etched by using the fourth photosensitive film pattern 320d as a mask. As a result, the auxiliary electrode 290 may be formed (S450, S460). The process for selectively removing a part of the conductive metal pattern 290b may be a third wet process, and the etchant may be the same as that used in the first wet process. Thereafter, the fourth photosensitive film pattern 320d is removed.

In the method for manufacturing a liquid crystal display according to an embodiment of the present disclosure, rather than integrally etching the conductive metal layer 290a and the conductive material layer 290b in the fourth mask process (S400), after the conductive metal layer 290a is first etched to form the conductive metal pattern 290b, the conductive material layer 280a may be etched by using the conductive metal pattern 290b as a mask. Accordingly, even when the conductive metal pattern 290b is etched, since the conductive metal pattern 290b is positioned on the organic insulating film 270, it is possible to prevent the organic insulating film 270 from being etched. In particular, it is possible to prevent an undercut in which the organic insulating film 270 located below the common electrode 290 is partially etched.

Although it is not illustrated in the drawings, in the fourth mask process, the auxiliary electrode connection section (not illustrated) may be formed on the gate pad connection section connected to the gate pad.

Figure 19:
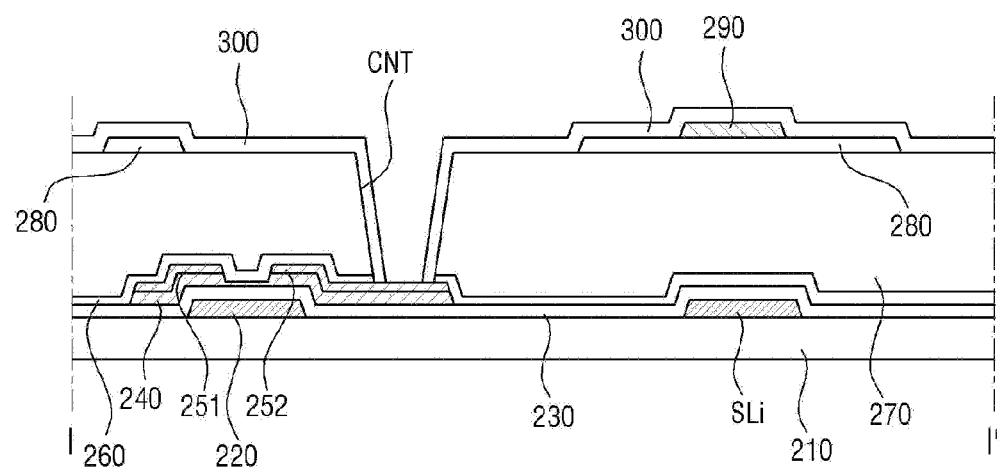
FIG. 19 is a diagram for explaining a fifth mask process of the method for manufacturing the liquid crystal display according to an embodiment of the present disclosure.

FIG. 19 is a diagram for explaining a fifth mask process (S500) of the method for manufacturing a liquid crystal display according to an embodiment of the present disclosure. The fifth mask process (S500) is described with reference to FIGS. 4, 5 and 19.

The second passivation film 300 may be disposed on the common electrode 280 and the auxiliary electrode 290. The second passivation film 300 may be formed of an inorganic insulator or an organic insulator such as silicon nitride and silicon oxide. Although it is not illustrated in the drawings, a contact hole CNT that exposes the drain electrode 252 may be formed by selective etching of the second passivation film 300. Although it is not illustrated in the drawings, it is possible to form a contact hole that exposes an auxiliary electrode connection section (not illustrated) and a data pad (not illustrated) connected to the gate pad, through the etching process of the second passivation film 300.

Figure 20:
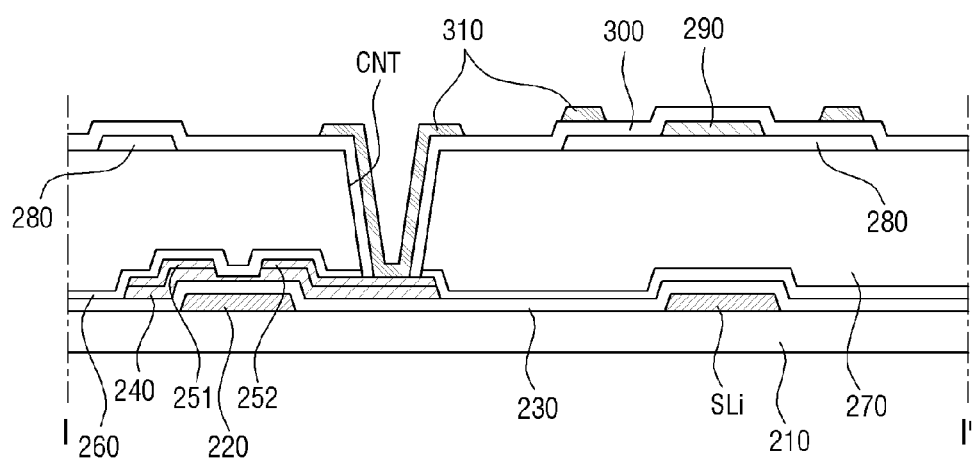
FIG. 20 is a diagram for explaining a sixth mask process of the method for manufacturing the liquid crystal display according to an embodiment of the present disclosure.

FIG. 20 is a diagram for explaining a sixth mask process (S600) of the method for manufacturing a liquid crystal display according to an embodiment of the present disclosure. The sixth mask process (S600) is described with reference to FIGS. 4, 5 and 20.

The pixel electrode 310 may be disposed on the second passivation film 300. More specifically, first, a transparent conductive material layer (not illustrated) may be disposed on the second passivation film 300. The transparent conductive material layer may include one selected from a transparent material group containing indium zinc oxide (IZO) and indium tin oxide (ITO). Thereafter, by selectively etching the transparent conductive material layer (not illustrated) through a mask process, it is possible to form a pixel electrode 310 that at least partially overlaps the common electrode 280.

Figure 21:
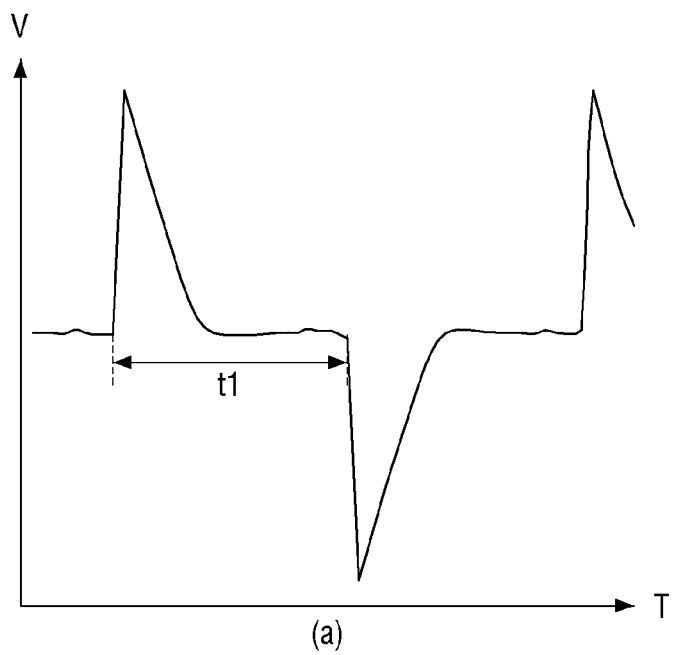
FIG. 21 is a graph for explaining an effect of the liquid crystal display according to an embodiment of the present disclosure.
Figure 21:
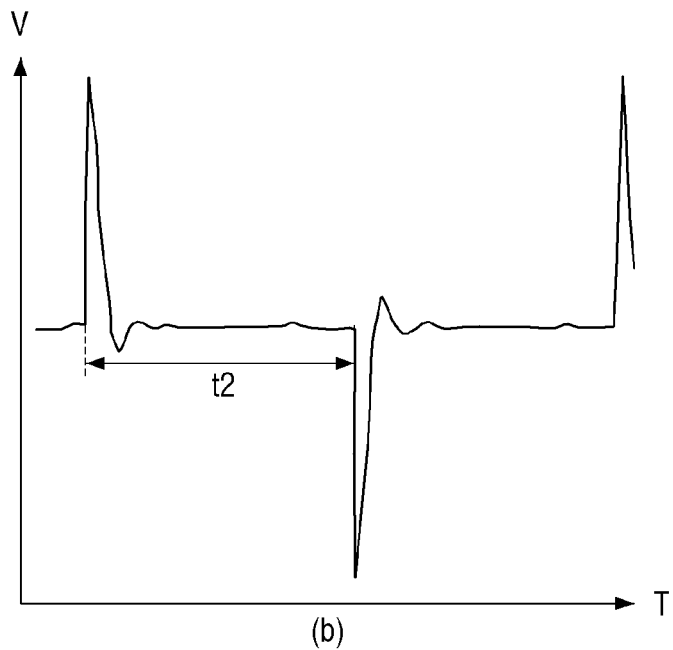

FIG. 21 is a graph for explaining an effect of the liquid crystal display according to an embodiment of the present disclosure.

In the liquid crystal display according to an embodiment of the present disclosure, it is possible to remove a contact hole connected to the existing common electrode by disposing the auxiliary electrode on the common electrodes 280 290, and it is possible to reduce the time taken to stabilize the ripple of the common voltage without reduction of an aperture ratio. Referring to FIG. 21, in the case (a) of a conventional liquid crystal display, the stabilization time of the common voltage Vcom for a 1H (t1) period (approximately 10.41 usec) may be approximately 5.92 usec. In contrast, in the case (b) of the liquid crystal display according to the present invention, the stabilization time of the common voltage Vcom b for a 1H (t2) period (approximately 11.32 usec) may be approximately 10.209 usec. Thus, the liquid crystal display according to an embodiment of the present disclosure may reduce the time taken to stabilize the common voltage Vcom by approximately twice the prior art.

Meanwhile, in the liquid crystal display according to an embodiment of the present invention, rather than integrally etching the conductive metal layer 290a and the conductive material layer 290b in the step of forming the common electrode 280 and the auxiliary electrode 290, first, after etching the conductive metal layer 290a to form the conductive metal pattern 290b, the conductive material layer 280a may be etched by using the conductive metal pattern 290b as a mask. Accordingly, even when the conductive metal pattern 290b is etched, it is possible to prevent the organic insulating film 270 from being etched since the conductive metal pattern 290b is positioned on the organic insulating film 270. In particular, it is possible to prevent an undercut in which the organic insulation film 270 located below the common electrode 290 is partially etched.

While the present disclosure has been particularly illustrated and described with reference to exemplary embodiments thereof, those of ordinary skill in the art would understand that various changes in form and detail may be made therein without departing from the spirit and scope of the present disclosure. The exemplary embodiments should be considered in a descriptive sense only and not for purposes of limiting the present disclosure.

What is claimed is:

1. A method for manufacturing a liquid crystal display, the method comprising:
   preparing a substrate on which a switching element covered with a first insulating film is formed;
   laminating a conductive material layer and a conductive metal layer on the first insulating film;
   forming a first photosensitive film pattern on the conductive metal layer, the first photosensitive film pattern comprising a first region having a first thickness and a second region having a second thickness greater than the first thickness;
   forming a conductive metal pattern by etching the conductive metal layer by using the first photosensitive film pattern as a mask;
   forming a second photosensitive film pattern that exposes a part of the conductive metal pattern by removing the first region of the first photosensitive film pattern;
   after forming the second photosensitive film pattern, forming a common electrode by etching the conductive material layer by using the conductive metal pattern as a mask; and
   forming an auxiliary electrode by etching the exposed conductive metal pattern by using the second photosensitive film pattern as a mask.

2. The method of claim 1, further comprising:
   after forming the auxiliary electrode,
   forming a second insulating film on the auxiliary electrode and the common electrode; and
   forming a pixel electrode on the second insulating film.

3. The method of claim 1, wherein a gate line is further formed on the substrate, the gate line comprising a gate electrode extending in a first direction and connected to the switching element, and
   the auxiliary electrode is formed to be disposed in the first direction.

4. The method of claim 3, wherein the auxiliary electrode is formed to at least partially overlap the gate line.

5. The method of claim 1, wherein forming the conductive metal pattern comprises:
   forming the conductive metal pattern through a wet etching by using the first photosensitive film pattern as a mask.

6. The method of claim 1, wherein forming the common electrode comprises forming the common electrode through a first wet etching by using the conductive metal pattern as a mask; and
   forming the auxiliary electrode comprises forming the auxiliary electrode through a second wet etching by using the second photosensitive film pattern as a mask.

7. The method of claim 6, wherein the different etchants are used in the first and second wet etching use.

8. The method of claim 1, wherein the auxiliary electrode is formed from at least one material selected from aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi).

9. The method of claim 1, wherein preparing the substrate comprises:
   forming a gate line on the substrate;
   forming a semiconductor pattern, a source electrode and a drain electrode on the gate line so as to be insulated from the gate line; and
   forming a first insulating film that is disposed on the source electrode and the drain electrode and exposes at least a part of the drain electrode.

10. The method of claim 9, wherein forming the semiconductor pattern, the source electrode and the drain electrode comprises:
   sequentially laminating a semiconductor layer and a conductive metal layer on the gate insulating film disposed on the gate line;
   forming a third photosensitive film pattern on the conductive metal layer, the third photosensitive film pattern comprising a third region having a third thickness and a fourth region having a fourth thickness greater than the third thickness;
   forming a conductive metal pattern and a semiconductor pattern by etching the conductive metal layer and the semiconductor layer by using the third photosensitive film pattern as a mask;

forming a fourth photosensitive film pattern that exposes a part of the electrode pattern by removing the third region of the third photosensitive film pattern; and forming the source and drain electrodes by etching the conductive metal pattern by using the fourth photosensitive film pattern as a mask.

11. The method of claim 9, wherein one end of the source electrode and one end of the semiconductor pattern are located on the same plane, and one end of the drain electrode and another end of the semiconductor pattern are located on the same plane.

\* \* \* \* \*